(12) United States Patent
Kurle et al.

(10) Patent No.: US 6,778,400 B2
(45) Date of Patent: Aug. 17, 2004

(54) ELECTRONIC DEVICE

(75) Inventors: Juergen Kurle, Reutlingen (DE); Kurt Weiblen, Metzingen (DE); Stefan Pinter, Reutlingen (DE); Frieder Haag, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/030,994

(22) PCT Filed: May 9, 2001

(86) PCT No.: PCT/DE01/01767

§ 371 (c)(1),
(2), (4) Date: May 13, 2002

(87) PCT Pub. No.: WO01/87029

PCT Pub. Date: Nov. 15, 2001

(65) Prior Publication Data

US 2002/0149916 A1 Oct. 17, 2002

(30) Foreign Application Priority Data

May 11, 2000 (DE) .......................... 100 22 968

(51) Int. Cl.⁷ .............................. H05K 5/00; H05K 5/04; H05K 5/06
(52) U.S. Cl. ...................... 361/752; 361/796; 361/803; 361/758; 361/742
(58) Field of Search ................................ 361/752, 758, 361/803, 742, 796, 735, 790, 730, 770, 804, 825, 736, 789, 785, 878; 439/38 G

(56) References Cited

U.S. PATENT DOCUMENTS 5,444,297 A * 8/1995 Oshima et al. ............. 257/691

6,325,642 B2 * 12/2001 Asao .......................... 439/76.2

FOREIGN PATENT DOCUMENTS

| DE | 195 03 778 | 8/1996 |
| DE | 198 03 358 | 8/1999 |
| DE | 198 51 455 | 8/1999 |
| JP | 04 123 487 | 4/1992 |
| WO | 99 40285 | 8/1999 |

* cited by examiner

Primary Examiner—David A. Zarneke
Assistant Examiner—Thanh Y. Tran
(74) Attorney, Agent, or Firm—Kenyon & Kenyon

(57) ABSTRACT

An electronic device, including a housing part having at least one closable opening and one plug-in part, the housing part accommodating a printed circuit board, which has at least one electrical and/or electronic component arranged thereon, and electrical contact elements, which are electrically connected to the plug-in part, and which have ends in the housing interior that run parallel to each other and protrude in the direction of the at least one opening, the ends being passed through contact openings of the printed circuit board and being connected conductively to the printed circuit board. To protect impact-sensitive and vibration-sensitive components, it is proposed to provide the contact elements, on a part of their length not inserted into the contact openings, with elastically deformable segments and to flexibly support the printed circuit board in the housing part by the contact element configured in this way, and, additionally, to connect it via damping elements at least indirectly to the housing part.

14 Claims, 2 Drawing Sheets

US 6,778,400 B2

ELECTRONIC DEVICE

FIELD OF THE INVENTION

The present invention relates to an electronic device.

BACKGROUND INFORMATION

An electronic device of this type is known, for example, from PCT Publication No. 99/40285. The electronic module depicted in that publication includes a housing part having a plug-in part, a printed circuit board finished with electrical/electronic components being inserted into the housing part, the ends of the contact elements connected to the plug-in part being passed through contact openings of the printed circuit board in the interior of the housing part and being electrically connected to the contact openings.

In recent times, sensors have been increasingly used in motor vehicles, the sensors including impact- and vibration-sensitive components, such as micromechanically manufactured semiconductor sensor elements, which as a result of patterning have, configured in one plane, semiconductor patterns that are mechanically very sensitive and that quickly break in response to powerful impacts. If one of these impact- and vibration-sensitive components is mounted on a printed circuit board and is inserted into a housing part in accordance with the known design described above, the contact elements of the housing part extending through contact openings of the printed circuit board, then impact- and/or vibration-stresses arch transmitted undamped via the contact elements and the mounting elements of the housing part to the printed circuit board and the component. In response to powerful impacts, such as arise in a collision after a free fall, the micromechanical patterns are deformed by the inertial forces operating in that case beyond the breaking point of the material and in this way are destroyed.

SUMMARY OF THE INVENTION

As a result of the simply and economically designed electronic device, the vibrations and mechanical impacts operating on the housing part are transmitted to the printed circuit board and the components situated thereon only in very damped fashion. The printed circuit board having the electronic components is flexibly supported in the housing part by the electrical contact elements that electrically connect the housing plug connectors to the printed circuit board. For this purpose, the contact elements are furnished with elastically deformable segments. Damping elements manufactured separately from the contact elements damp the vibration of the spring-mass system. In this context, the damping elements may constitute, in particular, a low pass and may prevent the transmission of high frequency vibrations to the printed circuit board and the components located thereon. Because the spring suspension is simultaneously realized by the electrical contact elements, there is no need for using separate spring elements, such as spiral springs, for supporting the printed circuit board in the housing part. The electronic device may be manufactured simply and economically, it being possible to employ the assembly techniques that have been used heretofore.

As a result of the fact that the elastically deformable contact element segments, which are not inserted into the contact openings, may be deflected in an elastic fashion in at least one direction perpendicular to the printed circuit board, but preferably in all three directions in space, it is possible in accordance with demand to realize a flexible support of the printed circuit board in one, two, or all three directions in space.

It is especially advantageous if when being plugged in the printed circuit board is slipped through the opening of the housing part onto the ends of the contact elements such that the ends penetrate in a contacting manner into the contact openings. This may be carried out particularly easily and economically, because then it is not absolutely necessary, for generating the electrical contact, to solder the contact elements to the contact openings of the printed circuit board.

Stop elements may advantageously be provided, which limit a deflection of the elastically deformable segments, in the plug-in direction of the printed circuit board onto the ends of the contact elements. As a result of the stop elements, it can be achieved that the contact elements, when the printed circuit board is mounted, give way into the housing interior only a predefined amount. As soon as the elastically deformable segments strike against the stop elements, the ends of the contact elements are pressed through the contact openings of the printed circuit board.

The stop elements can be configured simply and economically by a fixed segment of the contact elements, which contacts the interior wall of the housing part, opposite the housing opening.

The end faces of the printed circuit board are separated from the interior walls of the housing part by a gap, which makes possible in the housing interior a certain freedom of movement of the printed circuit board, which is suspended on the contact elements. The damping elements may be inserted into this gap and may connect the edge area of the printed circuit board to the housing part. As a result of the width of the gap and the size and elasticity of the damping elements, a defined damping can be achieved.

In addition, an interior wall of the housing part may be provided with a step, the upper side of which, facing the printed circuit board, constituting a stop for the printed circuit board when it is pushed onto the contact elements. As a result of the step, it is achieved that the contact elements, in a predefined portion of their length, penetrate through the contact openings. The damping elements may then be arranged between the side of the printed circuit board facing away from the housing opening and the frame.

It is especially advantageous if the damping elements are constituted by an elastomer, especially a liquid silicon rubber. In this case, the damping elements, before or after the printed circuit board is plugged onto the ends of the contact elements can easily be inserted into the housing part using a dispenser. The damping can easily be adjusted through the point of application and the quantity of elastomer.

It is also advantageous at the location of the damping elements to provide flow stop elements for limiting the liquid silicon rubber that is still capable of flowing immediately after its application.

DETAILED DESCRIPTION

Figure 1:
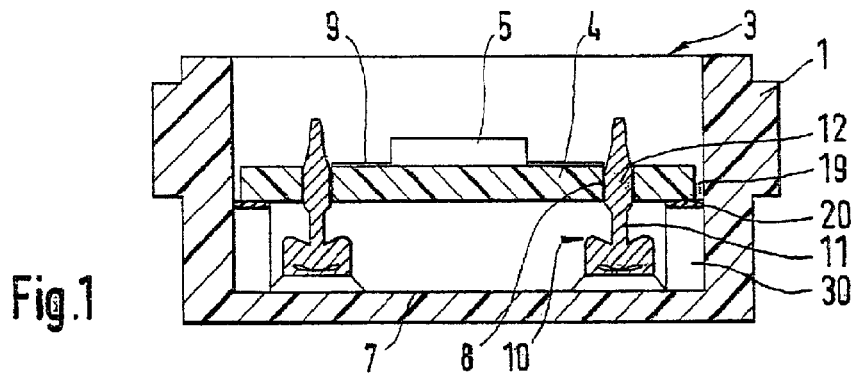
FIG. 1 depicts an electronic device in accordance with a first exemplary embodiment of the present invention, as the printed circuit board is being slipped onto the contact elements.
Figure 2:
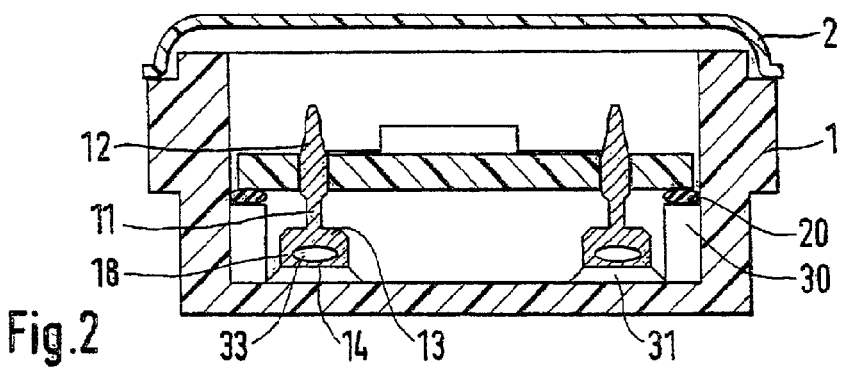
FIG. 2 depicts the electronic device from FIG. 1 after the installation of the printed circuit board.

In FIGS. 1 and 2, a first exemplary embodiment of the electronic device according to the present invention is depicted. In this case, it is a sensor, for example, an acceleration sensor, which includes an impact- and vibration-sensitive electronic component, for example, a micromechanical semiconductor sensor element. However, the design of the electronic device according to the present invention may also be used in other electronic devices, which include a housing part having a printed circuit board, arranged therein and furnished with at least one impact- and vibration-sensitive electrical and/or electronic component.

Figure 5:
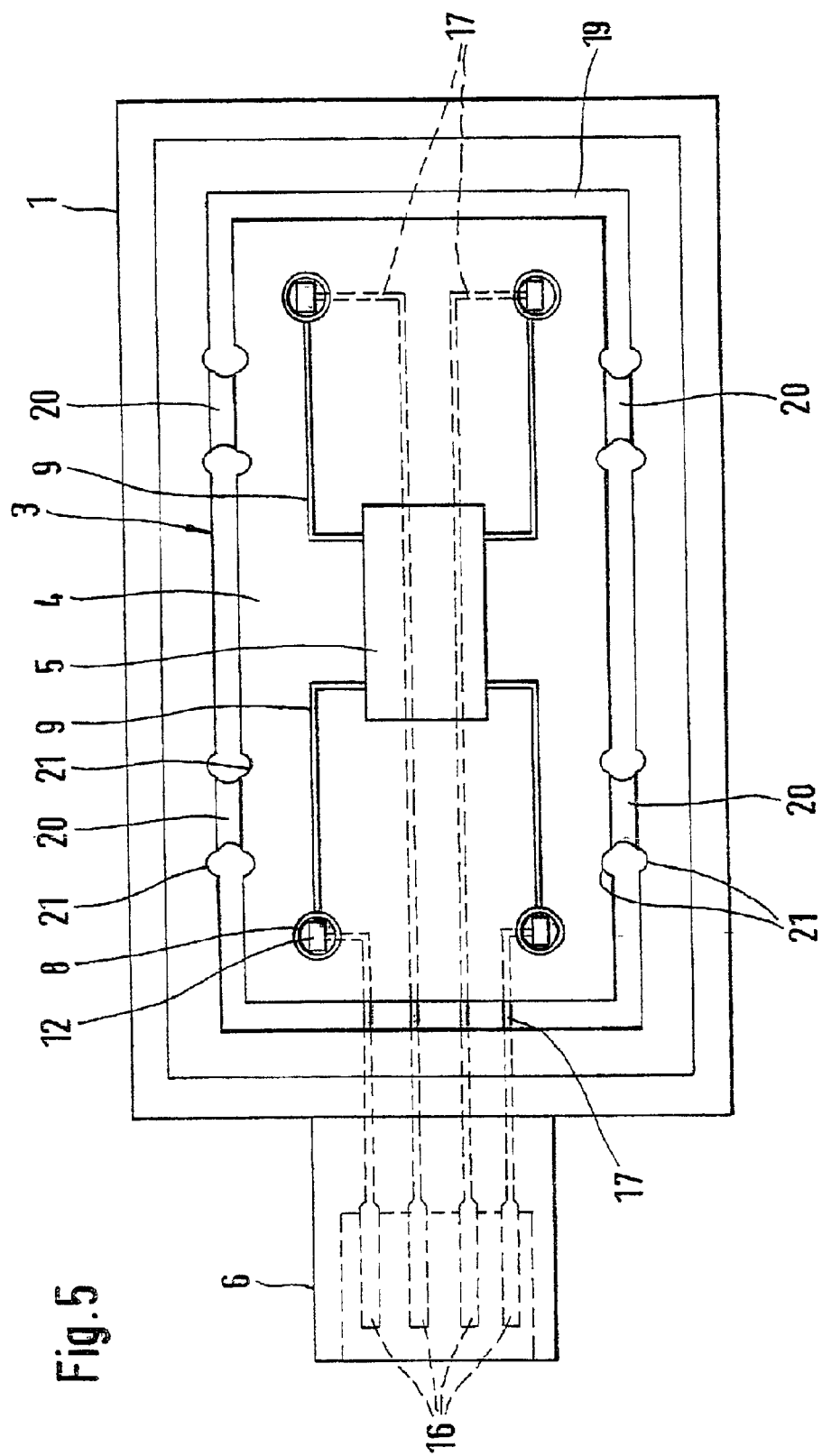
FIG. 5 depicts a top view of the electronic device according to the present invention when the housing cover has been removed.

The depicted electronic device includes a housing part 1 having a housing base and four side walls. An installation opening 3 opposite the housing base may be closed using a housing cover 2. As is depicted in FIG. 5, housing part 1 has an outside-accessible plug-in part 6 having plug-in pins 16 for connecting the device, for example, to a cable harness. In the housing interior, plug-in pins 16 are connected via electrical conductor connections 17 to metallic contact elements 10, whose ends 12 protrude from interior side 7 of the housing base perpendicular to opening 3. Plug-in pins 16, conductor connections 17, and contact elements 10 may be manufactured in one piece as metal insertion parts, for example, as stampings. Housing part 1 may be manufactured in a simple manner from an injection-molding mass in an injection molding process.

The side inner walls of housing part 1 are furnished with a circumferential step 30. Contact elements 10 have a segment 14, which contacts interior side 7 of the housing base in a planar fashion and which is connected to conductor connections 17. In addition, segment 14 may be connected to the housing base in a mechanically fixed manner. Lateral arms 18 protrude from segment 14 towards opening 3 of the housing part, the arms being joined to each other by a yoke-like segment 13. Segments 14, 18, and 13 of contact elements 10 enclose in cross section a cutout 33. In this context, at least segments 13 and 18 are configured so as to be elastically deformable. From segment 13, a segment 11 protrudes vertically towards opening 3 and inner wall 7. Thickened wall segments at ends 12 of segment 11 function as contact zones when contact elements 10 are inserted into contact openings 8 of printed circuit board 4. The printed circuit board may be, for example, a conventional epoxy resin substrate, a ceramic plate, or another known carrier substrate for electronic components. It is provided on its upper side with at least one impact- and vibration-sensitive electrical and/or electronic component 5. Component 5 is connected via printed circuit traces 9 to four hollow-cylindrical-shaped contact openings 8, which are configured as through-hole contacts and which functions to receive ends 12 of contact elements 10. In addition, damping elements 20 are provided. They may be made of rubber or liquid silicon rubber or a different material suitable for damping.

The manufacturing process for the device is as follows. After housing part 1 is made available, furnished with contact elements 10, plug-in part 6, and conductor connections 17, damping elements 20 are mounted onto the upper side of step 30 facing opening 3. There they may also be glued or secured in another manner. Then, printed circuit board 4 is slipped through opening 3 onto contact elements 10. In this context, as soon as printed circuit board 4 contacts ends 12 of contact elements 10, the latter initially give way into the housing interior in the plug-in direction of the printed circuit board, as is depicted in FIG. 1. In this context, elastic segments 13 and 18 become deformed. In one exemplary embodiment, segment 13 is deformed until it strikes against segment 14 of contact elements 10, which is provided as a stop element. In this context, damping elements 20 are simultaneously compressed. Since ends 12 of contact elements 10 can now recede no further, they penetrate into contact openings 8 of the printed circuit board, until printed circuit board 4 can be moved no further towards the upper side of step 30. In this context, the penetration depth of ends 12 in contact openings 8 is determined by the height of step 30. In a further exemplary embodiment, the spring tension of elastic segments 13 may also be so dimensioned that ends 12 of contact elements 10 only give way somewhat and then penetrate into contact openings 8, without segments 13 contacting segment 14.

If the constraining force exerted upon the printed circuit board in response to being forced down is eliminated, then the printed circuit board is conveyed into the resting position, depicted in FIG. 2, by the elastic spring tension of segments 13, 18 of contact elements 10 and by the elastic tensional force of the damping elements. In this position, the end faces of printed circuit board 4 are separated from the interior wall of housing part 1 by a gap 19. Printed circuit board 4 is flexibly supported in housing part 1 and at the same time is electrically connected to plug-in part 6 by contact elements 10. Damping elements 20 connect printed circuit board 4 to the upper side of step 30. Opening 3 may be closed using a housing cover 2. Impact and vibration stresses transmitted to housing part 1 are transmitted only in damped fashion to component 5 due to the vibration-damped spring suspension of the printed circuit board. In this context, damping elements 20 are advantageously designed so that they constitute a mechanical low pass.

Figure 3:
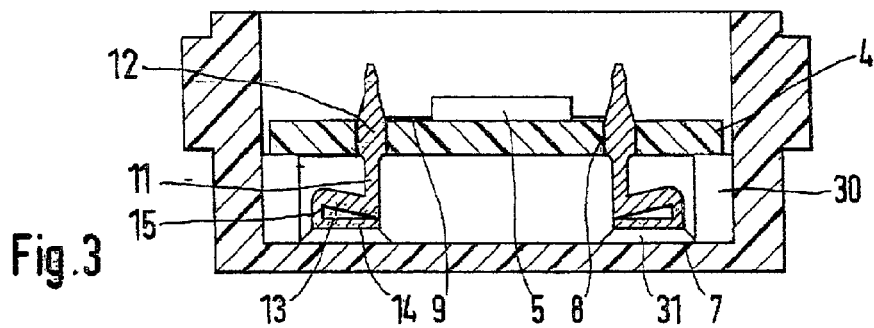
FIG. 3 depicts an electronic device according to a second exemplary embodiment of the present invention, as the printed circuit board is being slipped onto the contact elements.
Figure 4:
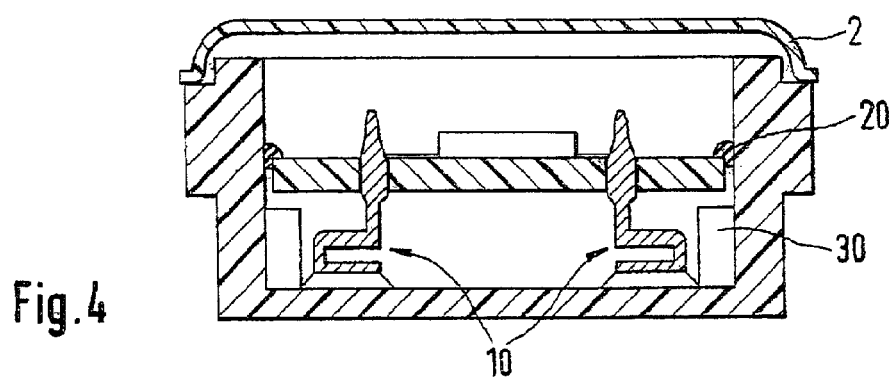
FIG. 4 depicts the electronic device from FIG. 3 after the installation of the printed circuit board.

A second exemplary embodiment of the present invention is depicted in FIG. 3 and FIG. 4. The same parts are furnished with the same reference numerals. In contrast to the first exemplary embodiment, in the electronic device from FIG. 3, the elastic segments of contact elements 10 have a different shape. From a fixed segment 14 furnished as stop element, a single arm 15 protrudes vertically, to which is connected a further segment 13, parallel to segment 14. Segments 13, 14, 15 form a C-shaped flexible contour. From segment 13, a segment 11 protrudes vertically with respect to interior wall 7, whose ends 12 contact printed circuit board 4. The elasticity of contact elements 10 in a direction perpendicular to printed circuit board 4 here results essentially from an elastic bend in segment 13 with respect to segment 15. However, the printed circuit board may also be deflected in response to a elastic torsion and/or a bending of elastic segments 13, 15, parallel to interior wall 7. Overall, therefore, as a result of contact elements 10 in this exemplary embodiment, a flexible deflection of printed circuit board 4 is possible in all three directions in space. Furthermore, in contrast to the exemplary embodiment from FIGS. 1 and 2, in this exemplary embodiment, damping elements 20 are only inserted into housing part 1 after the installation of printed circuit board 4. Therefore, printed circuit board 4 having contact openings 8 is first slipped onto ends 12 of contact elements 10, until printed circuit board 4 makes contact with step 30. In response to the insertion, segment 13 strikes against segment 14, so that the deflection of the elastic segment in the plug-in direction of the printed circuit board is limited and ends 12 may be pressed into the contact openings. In response to being released, printed circuit board 4, secured on contact elements 10, springs back. Only now are damping elements 20 put in. In this context, it is especially advantageous, using a dispenser, to insert damping elements 20, in the form of an elastomer, especially of a liquid silicon rubber, into gap 19 between the end faces of printed circuit board 4 and housing part 1. In this context, the damping is determined by the elasticity of the material, the distance bridged by the material, and the length of the inserted elastomer strips. Flow stop elements 21 function to precisely adjust the length of the elastomer strips. These elements, as depicted by way of example in FIG. 5, may be configured by cutouts in printed circuit board 4 and/or the housing interior wall. As a result of the flow stop elements, the expansion is limited of liquid silicon rubber 20 that is still capable of flowing immediately after its application.

What is claimed is:

1. An electronic device, comprising:
   a housing part including at least one closable opening and a plug-in part;
   a printed circuit board accommodated in the housing part;
   at least one of an electrical component and an electronic component arranged on the printed circuit board;
   a plurality of electrical contact elements electrically connected to the plug-in part, wherein:
      the plurality of electrical contact elements include ends in a housing interior running parallel to each other and protruding in a direction of the at least one closable opening,
      the ends pass through contact openings of the printed circuit board and are conductively connected to the printed circuit board, and
      the printed circuit board is flexibly supported in the housing part by the electrical contact elements;
   a plurality of elastically deformable segments arranged on parts of lengths of the electrical contact elements not inserted into the contact openings; and
   a plurality of damping elements via which the printed circuit board is joined at least indirectly to the housing part.

2. The electronic device according to claim 1, wherein: the elastically deformable segments are flexibly deflected at least in one direction perpendicular to the printed circuit board.

3. The electronic device according to claim 1, wherein: the elastically deformable segments are flexible in three spatial directions.

4. The electronic device according to claim 1, wherein: when plugged in, the printed circuit board is slipped onto the ends of the electrical contact elements such that the ends penetrate in a contacting manner into the contact openings.

5. The electronic device according to claim 1, wherein: the ends are soldered to the contact openings.

6. The electronic device according to claim 4, further comprising:
   a plurality of stop elements that limit a deflection of the elastically deformable segments in a plug-in direction of the printed circuit board onto the ends of the electrical contact elements.

7. The electronic device according to claim 6, wherein: the stop elements are formed by fixed segments of the electrical contact elements contacting an interior wall of the housing part opposite the at least one closable opening.

8. The electronic device according to claim 1, wherein: end faces of the printed circuit board are separated by a gap from interior walls of the housing part.

9. The electronic device according to claim 8, wherein: the damping elements are inserted into the gap and connect an edge area of the printed circuit board to the housing part.

10. The electronic device according to claim 1, wherein:
    an interior wall of the housing part includes a step, and
    an upper side of the step facing the printed circuit board forms a stop for the printed circuit board when the printed circuit board is slid onto the electrical contact elements.

11. The electronic device according to claim 10, wherein: the damping elements are situated between a side of the printed circuit board facing away from the at least one closable opening of the housing part and the upper side of the step.

12. The electronic device according to claim 1, wherein: each of the damping elements includes an elastomer.

13. The electronic device according to claim 12, wherein: the elastomer is a liquid silicon rubber.

14. The electronic device according to claim 13, further comprising:
    a plurality of flow stop elements arranged at a location of the damping elements and for restricting the liquid silicon rubber that is still capable of flowing immediately after the liquid silicon rubber is applied.

* * * * *